US008552438B2

(12) United States Patent
Li et al.

(10) Patent No.: US 8,552,438 B2
(45) Date of Patent: Oct. 8, 2013

(54) MULTI-LENS SOLID STATE LIGHTING DEVICES

(75) Inventors: Jin Li, Meridian, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 681 days.

(21) Appl. No.: 12/732,046

(22) Filed: Mar. 25, 2010

(65) Prior Publication Data

US 2011/0235306 A1 Sep. 29, 2011

(51) Int. Cl.
*H01L 29/20* (2006.01)

(52) U.S. Cl.
USPC ........... 257/89; 257/98; 257/99; 257/E33.073

(58) Field of Classification Search
USPC ................................ 257/89, 98, 99, E33.073
See application file for complete search history.

(56) References Cited

U.S. PATENT DOCUMENTS 5,568,320 A 10/1996 Rees et al.
7,029,147 B2 4/2006 Nawashiro
7,547,115 B2 6/2009 Chou
7,959,312 B2 * 6/2011 Yoo et al. ........................ 362/84
8,337,029 B2 * 12/2012 Li .................................. 362/84
2006/0097385 A1 * 5/2006 Negley .......................... 257/722
2007/0257272 A1 * 11/2007 Hutchins ......................... 257/98
2008/0062715 A1 3/2008 Park et al.
2008/0100774 A1 5/2008 Jeon et al.
2009/0166664 A1 * 7/2009 Park et al. ....................... 257/99
2010/0181582 A1 * 7/2010 Li et al. ........................... 257/91
2010/0219435 A1 * 9/2010 Kim et al. ....................... 257/98

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.

* cited by examiner

*Primary Examiner* — Minh-Laon T Tran
(74) *Attorney, Agent, or Firm* — Perkins Coie LLP

(57) ABSTRACT

Solid state lighting (SSL) devices including a plurality of SSL emitters and methods for manufacturing SSL devices are disclosed. Several embodiments of SSL devices in accordance with the technology include a support having a first lead and a second lead, a plurality of individual SSL emitters attached to the support, and a plurality of lenses. Each SSL emitter has a first contact electrically coupled to the first lead of the support and a second contact electrically coupled to the second lead of the support such that the SSL emitters are commonly connected. Each lens has a curved surface and is aligned with a single corresponding SSL emitter.

10 Claims, 6 Drawing Sheets

100
130
142
140
130
132 (converter material)
131 (transmissive material)
135
116
110
116
(-)
120
124
120
114

MULTI-LENS SOLID STATE LIGHTING DEVICES

TECHNICAL FIELD

The present technology is related to solid state lighting (SSL) devices and associated methods of manufacturing SSL devices. In particular, the present technology is related to SSL devices including a plurality of SSL emitters, such as a plurality of individual light emitting diodes (LEDs), and associated methods of manufacturing SSL devices with multiple emitters.

BACKGROUND

Mobile phones, personal digital assistants (PDAs), digital cameras, MP3 players, televisions, monitors, interior and exterior lights, and other electronic devices utilize SSL devices (e.g., white light LEDs) for illumination. However, true white light LEDs are not available because LEDs typically emit light at only one particular wavelength. For human eyes to perceive the color white, a mixture of wavelengths is needed.

One conventional technique for emulating white light with LEDs includes depositing a converter material (e.g., a phosphor) on an LED. For example, as shown in FIG. 1A, a conventional SSL device 10 includes a support 2, an LED 4 attached to the support 2, and a converter material 6 deposited on the LED 4. The LED 4 can include one or more light emitting components. For example, as shown in FIG. 1B, the LED 4 can include a silicon substrate 12, an N-type gallium nitride (GaN) material 14, an indium gallium nitride (InGaN) material 16 (and/or GaN multiple quantum wells), and a P-type GaN material 18 on one another in series. The LED 4 can also include a first contact 20 on the P-type GaN material 18 and a second contact 22 on the N-type GaN material 14. Referring to both FIGS. 1A and 1B, the LED 4 emits a blue light that stimulates the converter material 6 to emit a light (e.g., a yellow light) at a desired frequency. The combination of the emissions from the LED 4 and the converter material 6 appears white to human eyes if the wavelengths of the emissions are matched appropriately.

FIGS. 2A and 2B are cross-sectional and top plan views, respectively, of a conventional SSL device 50 having a plurality of commonly connected LEDs 4. Referring to FIG. 2A, the SSL device 50 can include a support 52, a plurality of LEDs 4 attached to the support 52, and a converter material 56 over the substrate 52 and the LEDs 4. The SSL device 50 also has a single lens 58 over the LEDs 4. Referring to FIG. 2B, the SSL device 50 can further include a plurality of electrostatic discharge devices (ESDs) 60 and an electrical circuit having a first contact 62 and a second contact 64. All of the LEDs 4 and ESDs 60 are commonly connected to the first contact 62 and the second contact 64 such that all of the LEDs 4 operate together.

One drawback of the conventional SSL device 50 is that the single, large lens 58 has a complex emission pattern and is subject to total reflection losses. The conventional SSL device 50, therefore, may not be useful for applications that require beams or other types of collimated light. Additionally, the complex emission patterns may have bright spots and dark spots that limit the utility of the SSL device 50 for applications that require uniformly diffused emissions (e.g., backlights for displays and televisions).

DETAILED DESCRIPTION

Various embodiments of SSL devices and associated methods of manufacturing SSL devices are described below. The term "LED" generally refers to a semiconductor diode that converts electrical energy into electromagnetic radiation in the visible, ultraviolet, infrared and/or other spectra. The term "phosphor" generally refers to a material that can continue emitting light after exposure to energy (e.g., electrons and/or photons). A person skilled in the relevant art will also understand that the technology may have additional embodiments and that the technology may be practiced without several of the details of the embodiments described below with reference to FIGS. 3A-6B.

Figure 3A:
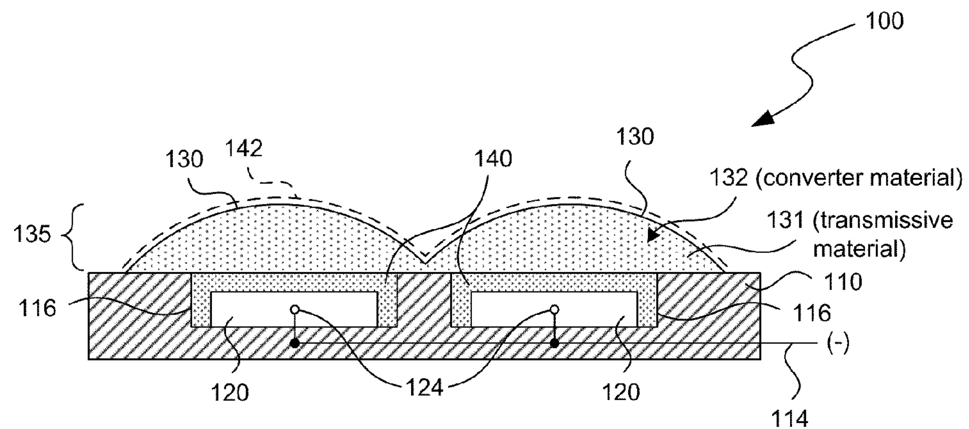
FIG. 3A is a schematic cross-sectional view of an SSL device having a plurality of commonly connected SSL emitters in accordance with an embodiment of the technology.
Figure 3B:
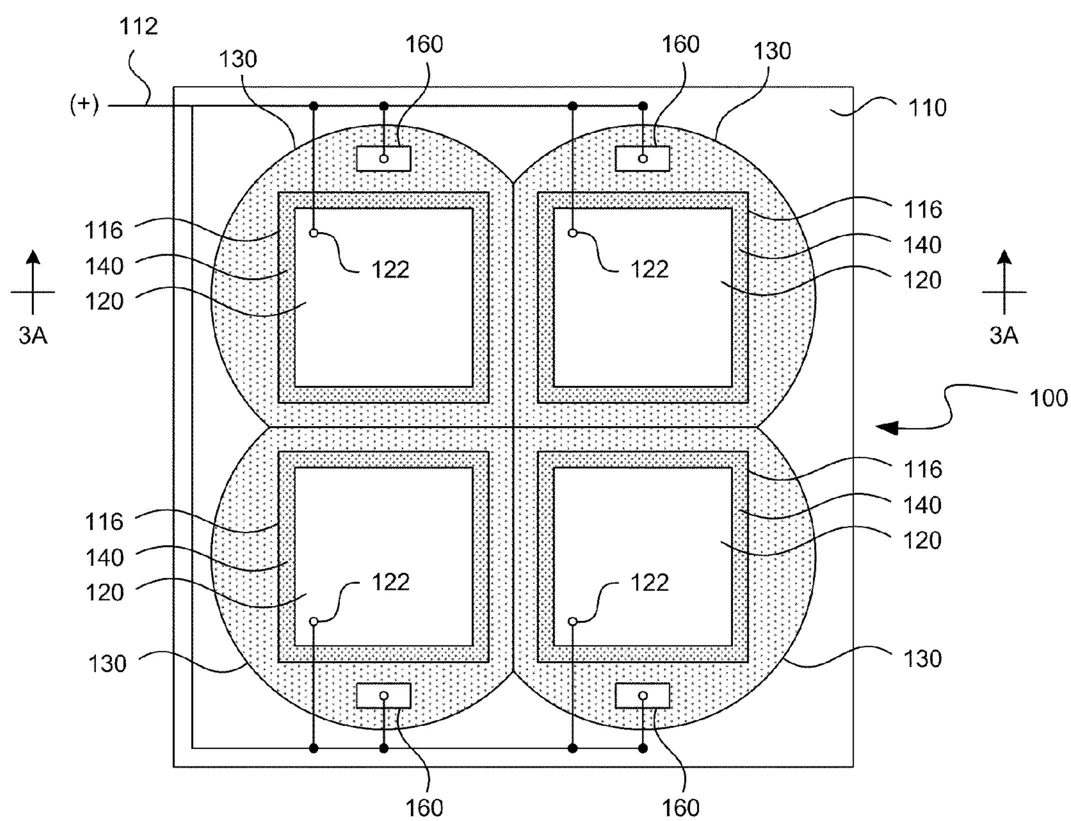
FIG. 3B is a schematic top plan view of the SSL device of FIG. 3A.

FIG. 3A is a schematic cross-sectional view and FIG. 3B is a schematic top plan view of an SSL device 100 in accordance with an embodiment of the technology. The SSL device 100 can include a support 110 having a first lead 112 (FIG. 3B) and a second lead 114 (FIG. 3A). The SSL device 100 can further include a plurality of SSL emitters 120 attached to the support 110 and a plurality of lenses 130. Each SSL emitter 120 has a first contact 122 (FIG. 3B) electrically coupled to the first lead 112 of the support 110 and a second contact 124 (FIG. 3A) electrically coupled to the second lead 114 of the support 110. Each lens 130 has a curved exterior surface (FIG. 3A) and is aligned with a single corresponding one of the SSL emitters 120.

The support 110 can be a printed circuit board having first traces that define the first lead 112 and second traces that define the second lead 114. The first lead 112 can be one of an anode or cathode, and the second lead 114 can be the other of the anode or cathode. In an alternative embodiment, the support 110 can be a copper, aluminum, or other type of metal base having a first metal portion defining the first lead (e.g., either the anode or cathode), and a second metal portion electrically isolated from the first portion that defines the second lead (e.g., the other of the cathode or anode). In still other embodiments, the support 110 can be ceramic or another suitable dielectric material. The support 110 includes a plurality of mounting sites at which one or more SSL emitters 120 can be mounted. The upper surface of the support 110 can be flat, or in other embodiments, as shown in FIG. 3A, the support 110 can include a plurality of depressions 116 that define the mounting sites. The depressions 116, for example, can be cavities sized and shaped to receive a single SSL emitter 120.

Figure 1A:
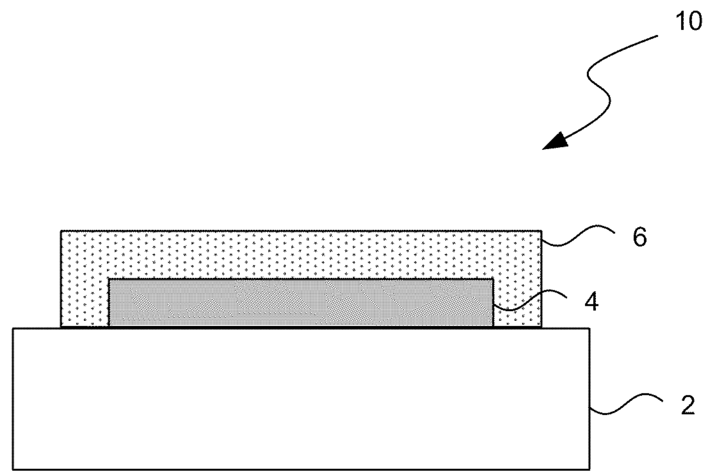
FIG. 1A is a schematic cross-sectional diagram of an SSL device in accordance with the prior art.
Figure 1B:
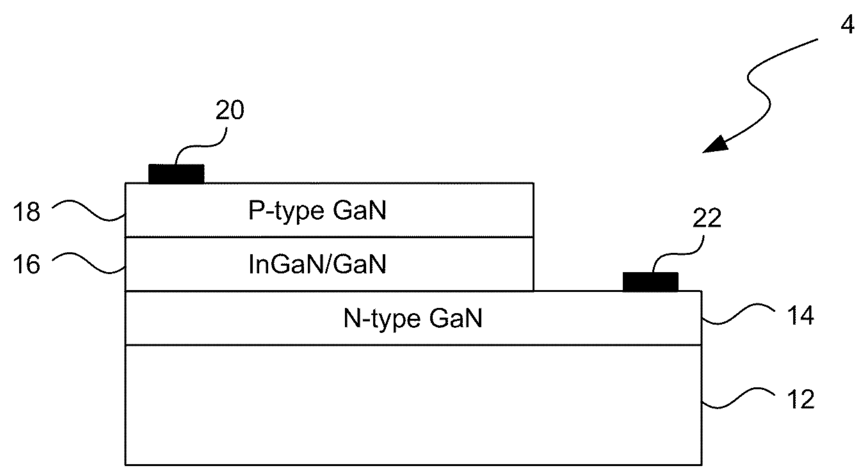
FIG. 1B is a schematic cross-sectional diagram of an LED device in accordance with the prior art.

The SSL emitters 120 can be LEDs configured to emit light in a desired spectrum. For example, the SSL emitters 120 can be configured to emit light in one or more of the following spectra: visible spectrum (e.g., from about 450 nm to about 650 nm); infrared spectrum (e.g., from about 680 nm to about 970 nm); near infrared spectrum (e.g., from about 1050 nm to about 1550 nm); and/or other suitable spectra. The SSL emitters 120 can be the same as the LED 4 shown in FIG. 1B; in other embodiments, the first contacts 122 of the SSL emitters 120 can be wire bonded to the first lead 112 of the support 110 and the second contacts 124 of the SSL emitters 120 can be surface mount contacts that are surface mounted to the second lead 114. For example, the second contacts 124 can be copper (Cu), aluminum (Al), Tungsten (W), stainless steel, or other suitable metal or metal alloy contacts on the back side of the SSL emitters 120 that can be surface mounted to corresponding surface mount contacts on the support 110. In other embodiments, an n-type GaN material at the bottom of the SSL emitters 120 can define the second contacts 124 for surface mounting to the support 110. Suitable surface mounting configurations are shown and described in the commonly owned U.S. application Ser. No. 12/721,016, entitled "Light Emitting Diode Wafer-Level Package with Self-Aligning Features," filed on Mar. 10, 2010, which is incorporated herein by reference.

In the embodiments illustrated in FIGS. 3A and 3B, the lenses 130 are lobes or integrated domes of an integral lens unit 135 in which each lens 130 (e.g., a single one of the lobes) is aligned with one of the SSL emitters 120. In other embodiments, the lenses 130 can be formed as discrete components in which each lens 130 is aligned with one of the SSL emitters 120. Each SSL emitter 120 can accordingly be associated with a single lens 130 in such embodiments. Additionally, the lenses 130 in either embodiment can abut, overlap, or otherwise contact each other to form a gapless lens unit.

The lenses 130 can include a transmissive material 131 made from silicone, polymethylmethacrylate (PMMA), resin, or other materials with suitable properties for transmitting the radiation emitted by the SSL emitters 120. The lenses 130 can further include an optional converter material 132, such as phosphor, that emits light at a different frequency to produce the perception of white light or another desired color to the human eye. The converter material 132 can have a composition that emits light at a desired wavelength under stimulation such that the combination of the emissions from the SSL emitters 120 and the converter material 132 emulates a white light. For example, in one embodiment, the converter material 132 can include a phosphor containing cerium(III)-doped yttrium aluminum garnet (YAG) at a particular concentration for emitting a range of colors including green, yellow and/or red under photoluminescence. In other embodiments, the converter material 132 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. When light and/or energized particles from the SSL emitters 120 irradiates the converter material 132, the phosphor is energized and emits light with desired characteristics.

The lenses 130 can each have a convex surface, and the maximum height of each lens can occur at the center of the lens. The lenses 130 can have a circular shape, or generally circular shape, except for the portion of the lenses 130 that join each other or otherwise overlap each other in such embodiments. In many embodiments, the center of each lens 130 at its highest point is aligned with the center of each corresponding SSL emitter 120. As explained in more detail below, the height of each individual lens 130 can be controlled by a molding process or the flow characteristics of the lens material.

In another embodiment, the SSL device 100 can further include a separate converter material 140 either in addition to or in lieu of the converter material 132 in the lenses 130. The converter material 140 can be deposited in the depressions 116 before the lenses 130 are formed or otherwise attached to the support 110. In a further alternate embodiment, a converter material 142 can be deposited onto the lenses 130 in addition to the converter material 132 in the lenses 130 and/or the converter material 140 in the depressions 116. The converter materials 132, 140 and 142 can all be the same substance that emits the same wavelength, or the converter materials 132, 140, and/or 142 can be different substances that emit different wavelengths of light to achieve the desired cumulative light from each lens 130. Additionally, the SSL device 100 can include an ESD 160 electrically coupled to a corresponding SSL emitter 120.

Figure 4:
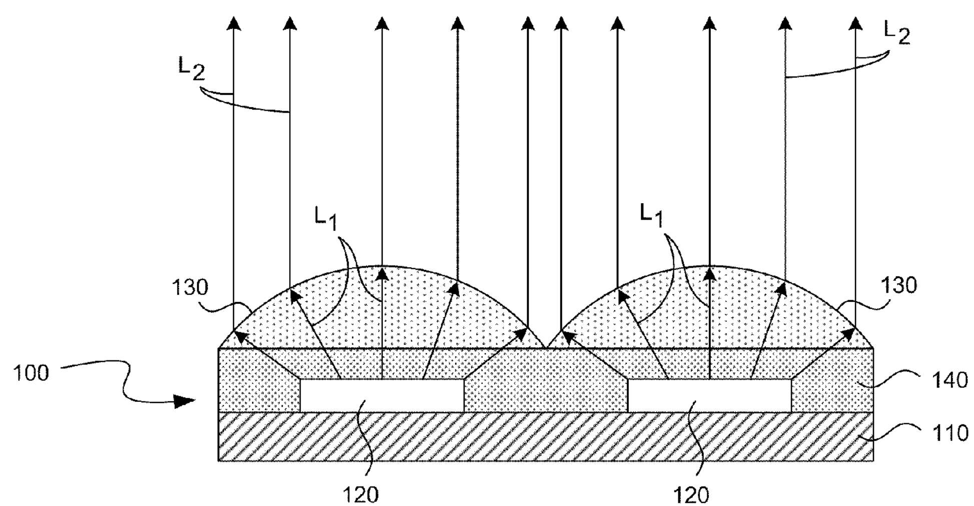
FIG. 4 is a schematic cross-sectional view of an SSL device having a plurality of commonly connected SSL emitters in accordance with another embodiment of the technology.

FIG. 4 is a schematic cross-sectional view illustrating another embodiment of the SSL device 100 in accordance with the technology. Like reference numbers refer to like components in FIGS. 3A-4. In the embodiment of the SSL device 100 shown in FIG. 4, the support 110 is flat and the converter material 140 is formed over and around the individual SSL emitters 120. The lenses 130 are then formed on or otherwise attached to the converter material 140. The lenses 130 illustrated in FIG. 4 abut each other without substantially overlapping each other. In other embodiments, the lenses 130 can be spaced apart from each other such that the perimeter of each lens 130 does not contact the perimeter of adjacent lenses.

FIG. 4 further illustrates the operation of the SSL device 100. In operation, the SSL emitters 120 emit point light $L_1$ that propagates in all directions and passes through the converter material 140 and the lenses 130. In certain embodiments, each lens 130 refracts the point light $L_1$ from its corresponding SSL emitter 120 into collimated light $L_2$ to form more coherent light. The lenses 130 illustrated in the embodiment of FIG. 4 refract only the light from their corresponding SSL emitters 120 with which they are aligned. In other embodiments, the lenses 130 can be formed to diffuse the point light $L_1$ into a controlled diffused pattern of light. The lenses 130 can accordingly be shaped to provide the desired type and pattern of light output from each SSL emitter 120.

Compared to conventional devices with a single lens over multiple LEDs, selected embodiments of the SSL devices 100 illustrated in FIGS. 3A-4 produce a collimated light output that can direct more light from the SSL emitters 120 to a desired target. Alternatively, other embodiments of the SSL devices 100 can provide more control of a diffused light output because the level of diffused light can be controlled for each SSL emitter 120 to provide a desired pattern or uniformity.

Figure 2A:
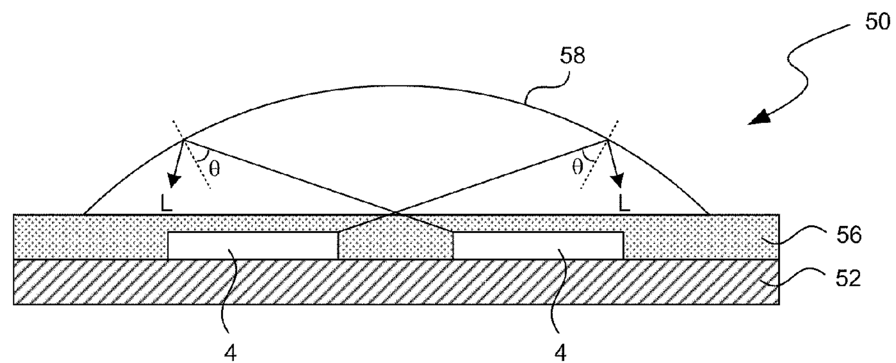
FIG. 2A is a schematic cross-sectional view of an SSL device having a plurality of commonly connected LEDs in accordance with the prior art.
Figure 2B:
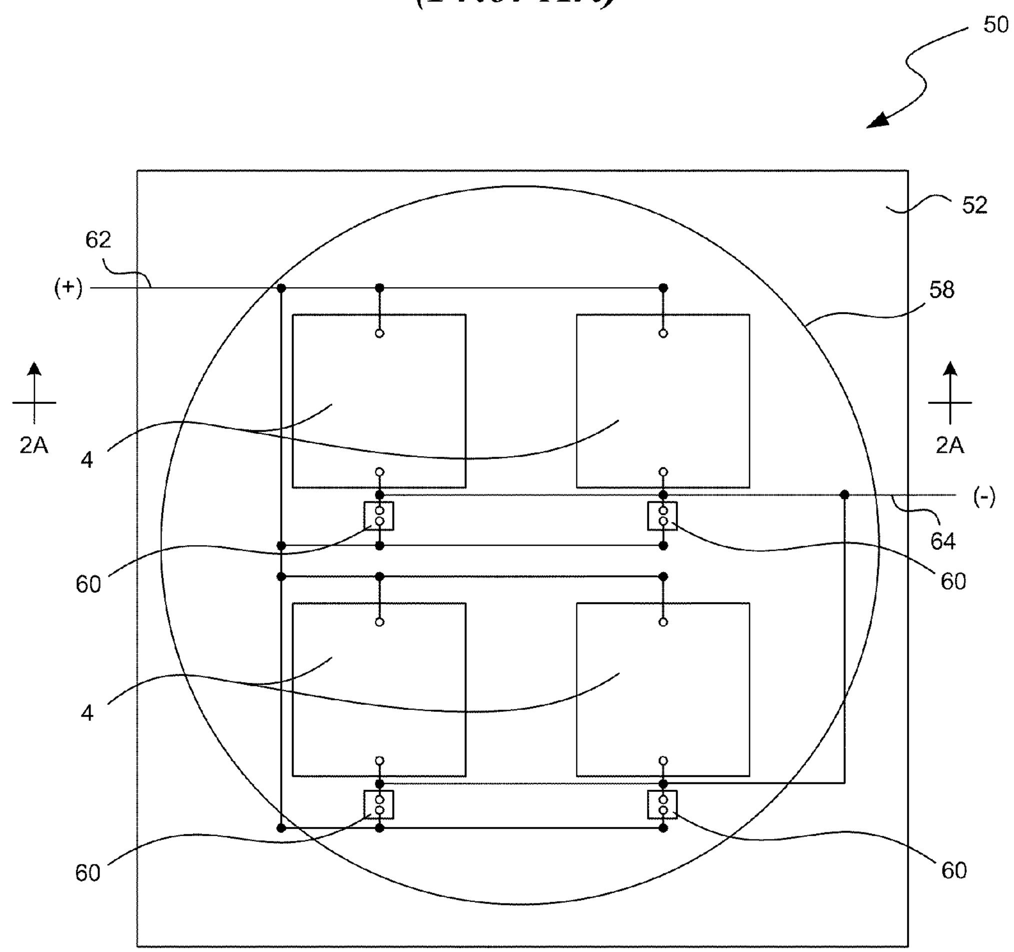
FIG. 2B is a top plan view of the SSL device of FIG. 2A.

Several embodiments of the SSL devices 100 further capture and output more light because the useful area of each lens relative to the position of the SSL emitters 120 is greater for the lenses 130 shown in FIGS. 3A-4 compared to the lens 58 shown in FIGS. 2A-2B. Several embodiments of the SSL devices 100 are accordingly more efficient than the conventional SSL device 50 shown in FIGS. 2A-2B because centering the maximum height of each lens 130 with the center of a corresponding SSL emitter 120 reduces total reflection losses compared to the lens 58 of the device 50. Referring to FIG. 2A, for example, light L from the LEDs 4 totally reflects back into the device when the incident angle θ becomes too large. Several embodiments of the SSL devices 100 overcome this problem because centering the lenses 130 with the center of each corresponding SSL emitter limits the amount of light with incident angles above the threshold that causes total reflection. Additionally, the SSL devices 100 have lower heights and use less lens material compared to the conventional multi-LED device shown in FIGS. 2A-2B.

Figure 5A:
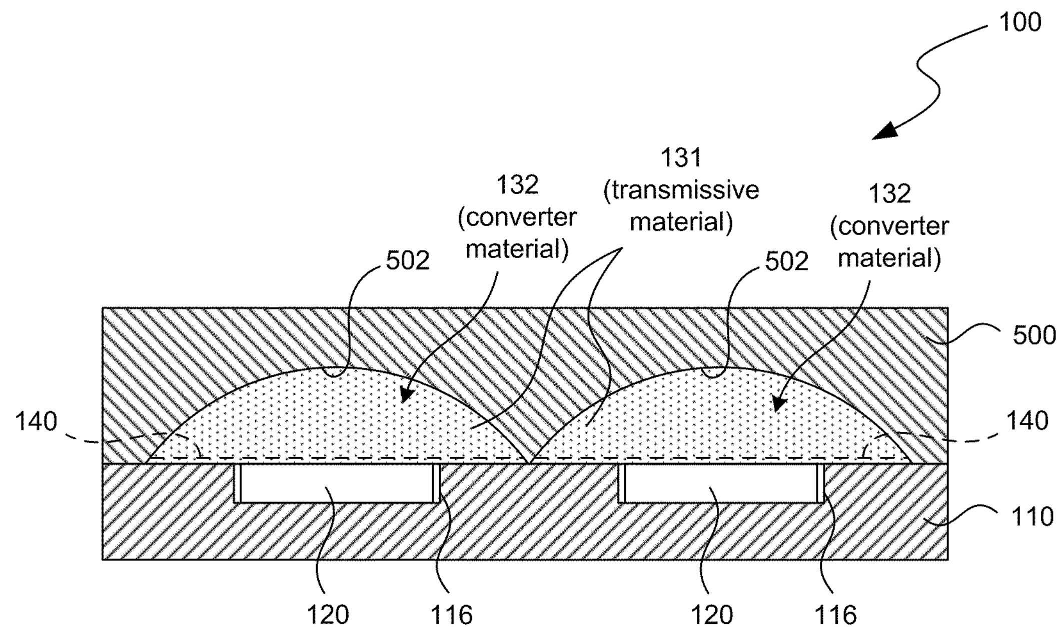
FIG. 5A is a schematic cross-sectional view of an SSL device having a plurality of commonly connected SSL emitters during a stage of a method for manufacturing SSL devices in accordance with an embodiment of the technology.
Figure 5B:
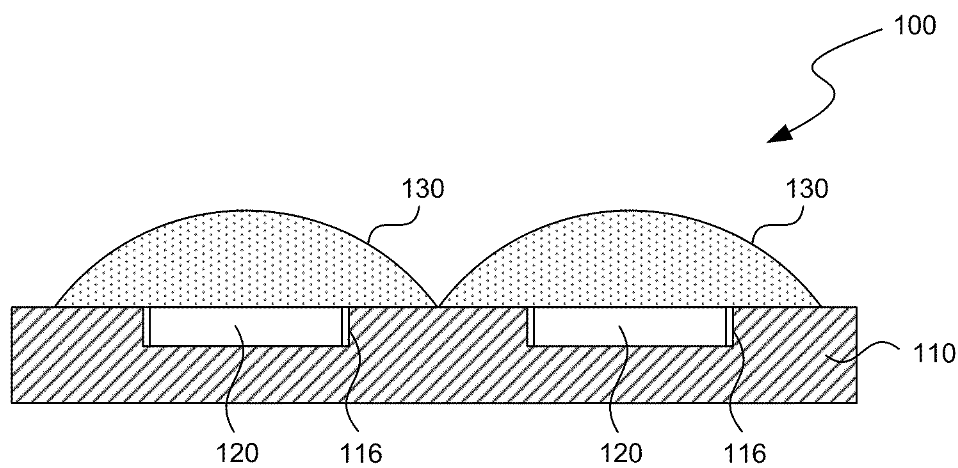
FIG. 5B is a schematic cross-sectional view of an SSL device having a plurality of commonly connected SSL emitters in accordance with another embodiment of the technology.

FIGS. 5A and 5B are schematic cross-sectional views illustrating another embodiment of the SSL device 100 and a method for forming the lenses 130 for any of the SSL devices shown in FIGS. 3A-5B in accordance with embodiments of the technology. Referring to FIG. 5A, the lenses 130 can be formed by positioning the support 110 against a mold 500 having cavities 502 in the shape of the lenses. In one embodiment, a lens material that includes the transmissive material 131, either with or without the converter material 132, can be injected into the cavities 502. In an alternative embodiment, a layer of such lens material can be deposited onto the support 110 and the mold 500 can be pressed against the support 110 to emboss or stamp the lens material into the shape of the cavities 502.

Referring to FIG. 5B, the mold 500 can be removed to leave the lenses 130 formed over the support 110. The lenses 130 are each aligned with a corresponding SSL emitter 120 in a centered one-to-one correspondence as described above. In the embodiment illustrated in FIG. 5B, the SSL emitters 120 are placed in the depressions 116 of the support 110 without a separate converter material in the depressions 116. The lenses 130 can be formed directly on the SSL emitters 120, or a converter material 140 (shown in FIG. 5A with broken lines) can be deposited on the SSL emitters 120, and the lenses 130 can be formed on the converter material 140. The converter material can also be formed on the lenses 130 as shown in FIG. 3A by the converter material 142.

The embodiments of the SSL devices 100 shown in FIGS. 4-5B accordingly have a support, a plurality of SSL emitters attached to the support, a plurality of lenses, and a converter material. The SSL emitters act as point sources that emit a point light at a first frequency, and the lenses are arranged relative to the SSL emitters such that each lens is aligned with a single one of the SSL emitters in a lens-emitter pair. Each lens has a curved surface, and each lens and the corresponding SSL emitter of a lens-emitter pair are configured such that all point light from the SSL emitter passes through the curved surface of the corresponding lens. The converter material is positioned over the SSL emitters, and the converter material emits light at a second frequency different than the first frequency.

Figure 6A:
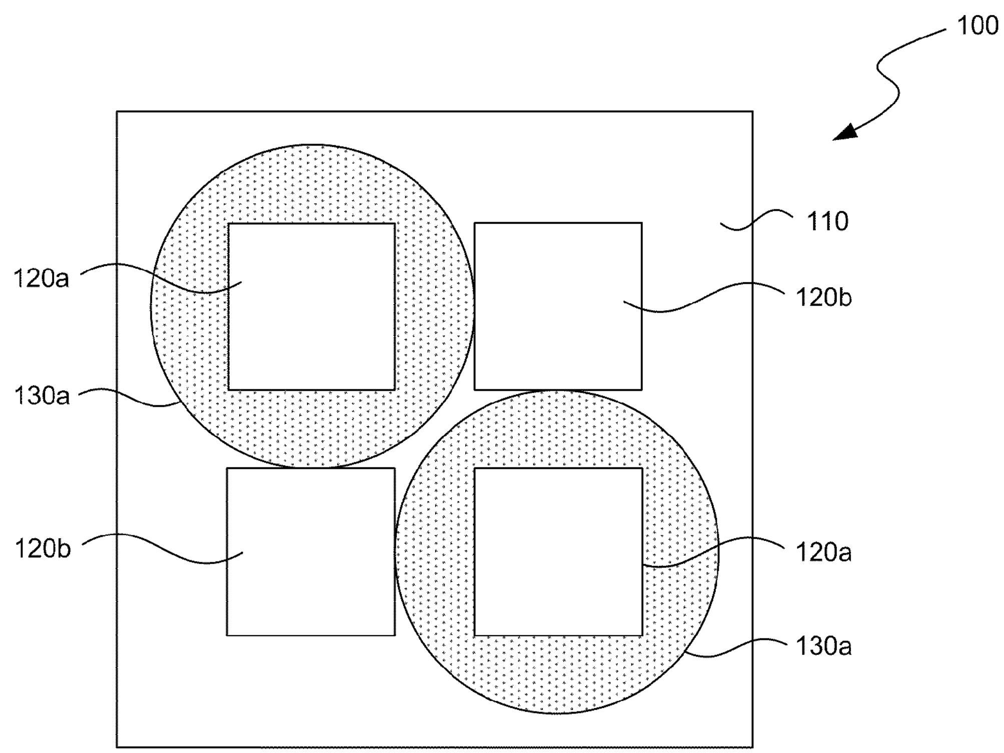
FIG. 6A is a schematic top plan view of an SSL device having a plurality of commonly connected SSL emitters during a stage of a method of manufacturing SSL devices in accordance with an embodiment of the technology.
Figure 6B:
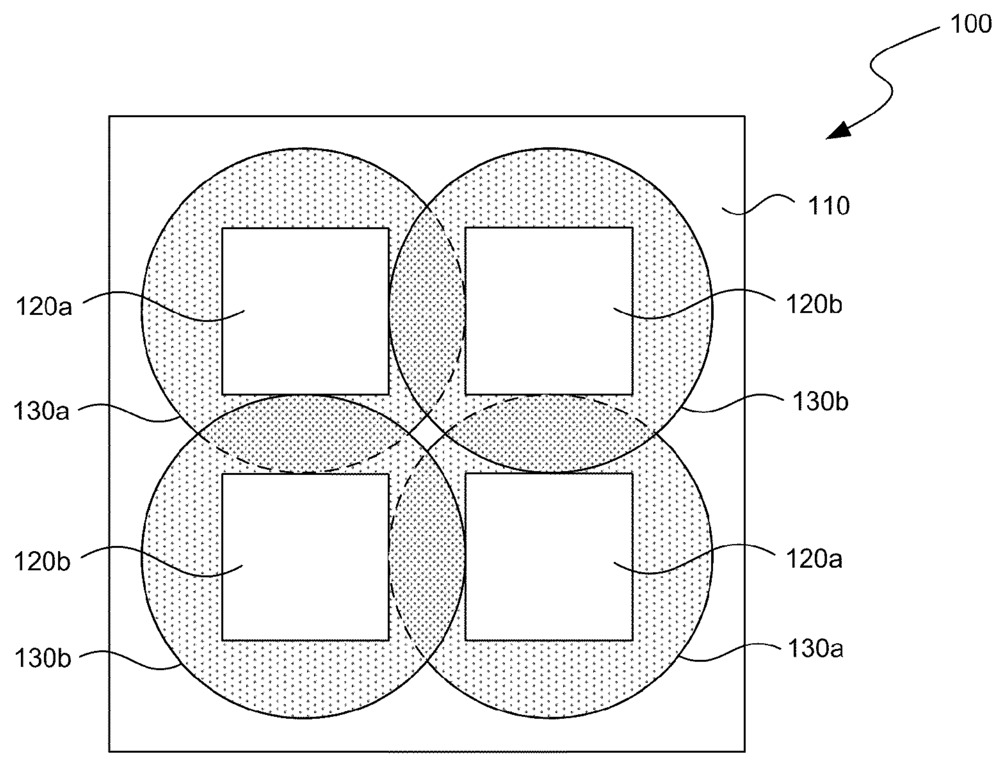
FIG. 6B is a schematic top plan view of an SSL device having a plurality of commonly connected SSL emitters in accordance with another embodiment of the technology.

FIGS. 6A and 6B are schematic top plan views of another embodiment of the SSL device 100 and a process for manufacturing the SSL devices 100 in accordance with embodiments of the technology. Referring to FIG. 6A, first lenses **130*a* can be formed over first SSL emitters 120*a* by photo-patterning a photosensitive lens material on a first pattern over corresponding first SSL emitters 120*a*. The first pattern of lens material is then reflowed and cured to form the first lenses 130*a* over the first SSL emitters 120*a*. FIG. 6B illustrates a subsequent stage in which second lenses 130*b* are formed over second SSL emitters 120*b* by photo-patterning a second pattern of photosensitive lens material over the second SSL emitters 120*b*. The second pattern of lens material is then reflowed in a second reflow process that forms the second lenses 130*b* over corresponding second SSL emitters 120*b*. The second lenses 130*b* can accordingly overlap portions of the first lenses 130*a***. Suitable photosensitive lens materials include photosensitive silicones manufactured by Shin Etsu of Japan.

The foregoing embodiments of SSL devices 100 can accordingly be manufactured by a method including attaching a plurality of SSL emitters to a support and positioning a plurality of lenses relative to the SSL emitters. The SSL emitters can be connected to a common anode and a common cathode, and the lenses can have a curved surface. Additionally, the lenses can be positioned relative to the SSL emitters such that each SSL emitter is aligned with a single one of the lenses.

From the foregoing, it will be appreciated that specific embodiments of the invention have been described herein for purposes of illustration, but well-known structures and functions have not been shown or described in detail to avoid unnecessarily obscuring the description of the embodiments of the invention. Reference terms such as “top,” “bottom,” and “side” are used for purposes of explanation and refer primarily to certain perspectives shown in the Figures, and are not limiting. The structures and components described herein may have a different orientation in operation than that shown in a Figure. Where the context permits, singular or plural terms may also include the plural or singular term, respectively. Unless the word “or” is associated with an express clause indicating that the word should be limited to mean only a single item exclusive from the other items in reference to a list of two or more items, then the use of “or” in such a list shall be interpreted as including (a) any single item in the list, (b) all of the items in the list, or (c) any combination of the items in the list.

Also, it will be appreciated that specific embodiments described above are for purposes of illustration and that various modifications may be made without deviating from the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. Accordingly, the present invention is not limited to the embodiments described above, which were provided for ease of understanding; rather, the invention includes any and all other embodiments defined by the claims.

We claim:

1. A solid state lighting (SSL) device, comprising:

a support having a first lead and a second lead;

a plurality of individual SSL emitters attached to the support, wherein each SSL emitter has a first contact electrically coupled to the first lead of the support and a second contact electrically coupled to the second lead of the support such that the SSL emitters are commonly connected;

a plurality of lenses having a transparent material and a converter material distributed in the transparent material, wherein each lens has a curved surface and is aligned with a single corresponding SSL emitter; and wherein the lenses are arranged such that each lens contacts an adjacent lens.

2. The SSL device of claim 1, wherein:

the support has a plurality of mounting sites and each mounting site has an anodic contact electrically coupled to the first lead and a cathodic contact electrically coupled to the second lead;

the SSL emitters are light emitting diodes (LEDs) that emit light at substantially the same wavelength; and each lens has a center aligned with a center of a corresponding LED.

3. The SSL device of claim 1, wherein the converter material comprises a phosphor selected to emit a desired color of light such that light from the SSL emitters and the light from the phosphor combine to create a desired color.

4. The SSL device of claim 1, wherein the support comprises a substrate including a plurality of depressions, and wherein each SSL emitter is positioned in a corresponding depression.

5. The SSL device of claim 4, wherein the substrate comprises a metal substrate and the SSL emitters have contacts surface mounted to the metal substrate.

6. A solid state lighting (SSL) device, comprising:

a support;

a plurality of SSL emitters attached to the support, wherein the SSL emitters act as point sources that each emit a point light at a first frequency;

a plurality of lenses arranged relative to the SSL emitters such that each lens is aligned with a single one of the SSL emitters in a lens-emitter pair, wherein each lens has a curved surface, and wherein each lens and corresponding SSL emitter of a lens-emitter pair are configured such that all point light from the SSL emitter passes through the curved surface of the corresponding lens; and wherein each lens contains a transparent material and a converter material distributed in the transparent material, wherein the converter material emits light at a second frequency different than the first frequency; and wherein the lenses are arranged such that each lens contacts an adjacent lens.

7. The SSL device of claim 6, wherein:

the support has a first lead configured to be coupled to a first potential of a power supply and a second lead configured to be coupled to a second potential of the power supply; and the SSL emitters each have a first contact electrically coupled to the first lead and a second contact electrically coupled to the second lead such that all of the SSL emitters are configured to be commonly connected to the power supply.

8. The SSL device of claim 6, wherein the SSL emitters comprise LEDs.

9. The SSL device of claim 6, wherein the support comprises a metal support having depressions, each depression is sized and shaped to receive one of the SSL emitters, and each SSL emitter is received in a depression.

10. The SSL device of claim 6, wherein the lenses are arranged such that each lens overlaps an adjacent lens.

* * * * *